US012597688B2

(12) United States Patent
Ouattara et al.

(10) Patent No.: US 12,597,688 B2
(45) Date of Patent: Apr. 7, 2026

(54) PHASE SHIFTERS WITH LOW AMPLITUDE VARIATION

(71) Applicants:STMICROELECTRONICS INTERNATIONAL N.V., Geneva (CH); CENTRE NATIONAL DE LA RECHERCHE SCIENTIFIQUE, Paris (FR); INSTITUT POLYTECHNIQUE DE GRENOBLE, Grenoble (FR); UNIVERSITE GRENOBLE ALPES, Saint Martin d'Hères (FR)

(72) Inventors: David Ouattara, Grenoble (FR); Cedric Durand, La Terrasse (FR); Frederic Paillardet, Tresserve (FR)

(73) Assignee: STMicroelectronics International N.V., Geneva (CH)

( * ) Notice: Subject to any disclaimer, the term of this patent is extended or adjusted under 35 U.S.C. 154(b) by 262 days.

(21) Appl. No.: 18/478,758

(22) Filed: Sep. 29, 2023

(65) Prior Publication Data

US 2025/0112350 A1     Apr. 3, 2025

(51) Int. Cl.
*H01P 1/18*          (2006.01)
*H03H 7/18*          (2006.01)
*H03H 11/20*         (2006.01)

(52) U.S. Cl.
CPC ............. *H01P 1/184* (2013.01); *H03H 7/185* (2013.01); *H03H 11/20* (2013.01)

(58) Field of Classification Search
CPC .......... H03H 7/20; H03H 7/185; H03H 11/20; H03H 11/16; H03H 17/08; H03H 7/09; H03H 11/245; H03H 7/18; H03H 7/19; H03H 7/25; H03H 7/38; H03H 7/482; H01P 1/184; H01P 1/185; H01P 1/18; H01P 5/16; H01P 3/08; H01P 5/186; H01P 5/227; H01Q 3/38
See application file for complete search history.

(56) References Cited

U.S. PATENT DOCUMENTS

| | | | |
|---|---|---|---|
| 7,355,492 B2 | 4/2008 | Hyman et al. | |
| 10,062,946 B2 | 8/2018 | Sharma et al. | |
| 11,824,245 B2 * | 11/2023 | Wang ........................ | H01P 1/18 |
| 2006/0006961 A1 | 1/2006 | Sengupta et al. | |
| 2019/0198957 A1 * | 6/2019 | Sharma .................. | H03H 11/22 |
| 2021/0376465 A1 * | 12/2021 | Dastjerdi ................ | H01P 1/185 |
| 2022/0137209 A1 * | 5/2022 | Alidio ................... | G01S 13/931 |
| | | | 342/75 |

FOREIGN PATENT DOCUMENTS

| | | |
|---|---|---|
| CN | 2424577 Y | 3/2001 |
| CN | 102270977 A | 12/2011 |
| KR | 20120135762 A | 12/2012 |

* cited by examiner

*Primary Examiner* — Lincoln D Donovan
*Assistant Examiner* — Tyler J Pereny
(74) *Attorney, Agent, or Firm* — Alston & Bird LLP

(57)          ABSTRACT
Various embodiments of the present disclosure provide a phase shifter including a plurality of digital phase shifters, each digital phase shifter of the plurality of the digital phase shifters configured to vary a phase of a phase shifter input signal by a corresponding phase shift value, and a continuous phase shifter configured to vary the phase of the phase shifter input signal with a variable phase shift value. In various embodiments, the continuous phase shifter comprises a continuous phase shifter load configured to receive a control voltage and vary the variable phase shift value using the control voltage.

17 Claims, 6 Drawing Sheets

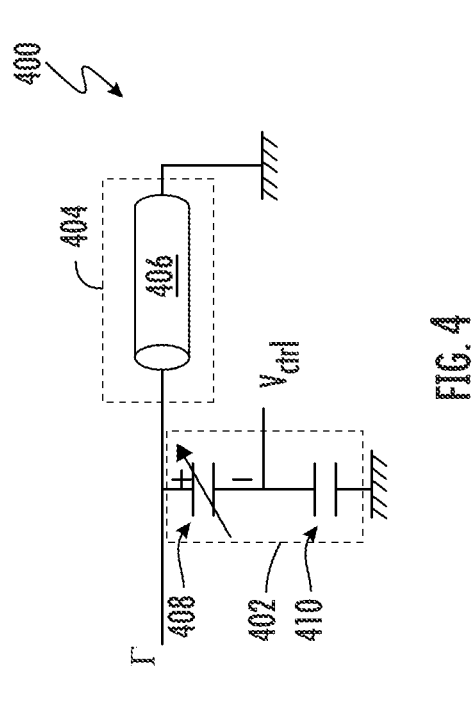
FIG. 4
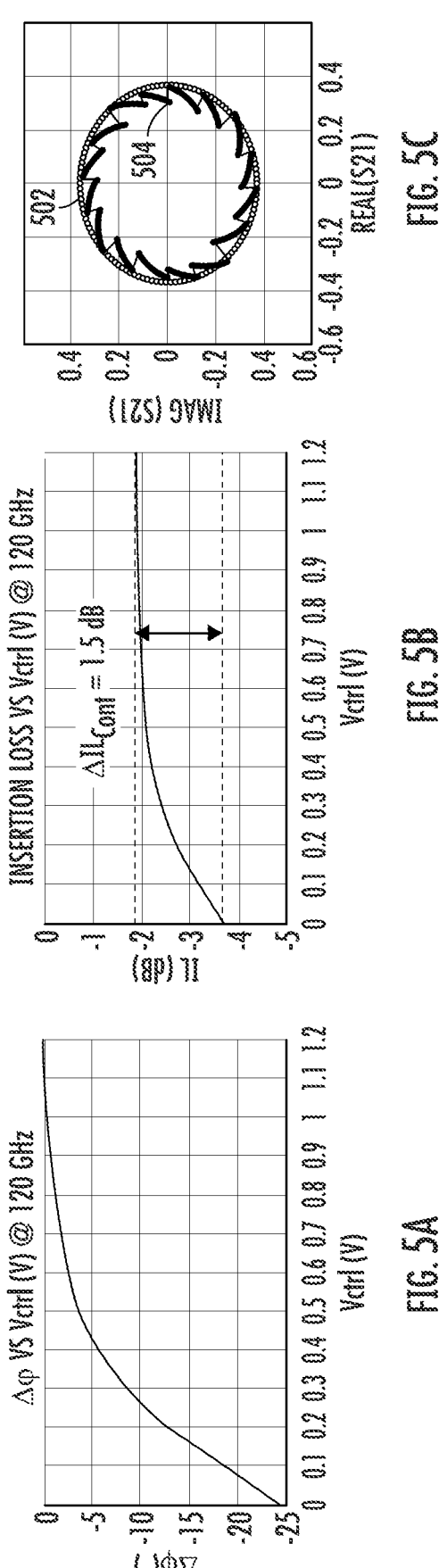
FIG. 5C
FIG. 5B
FIG. 5A

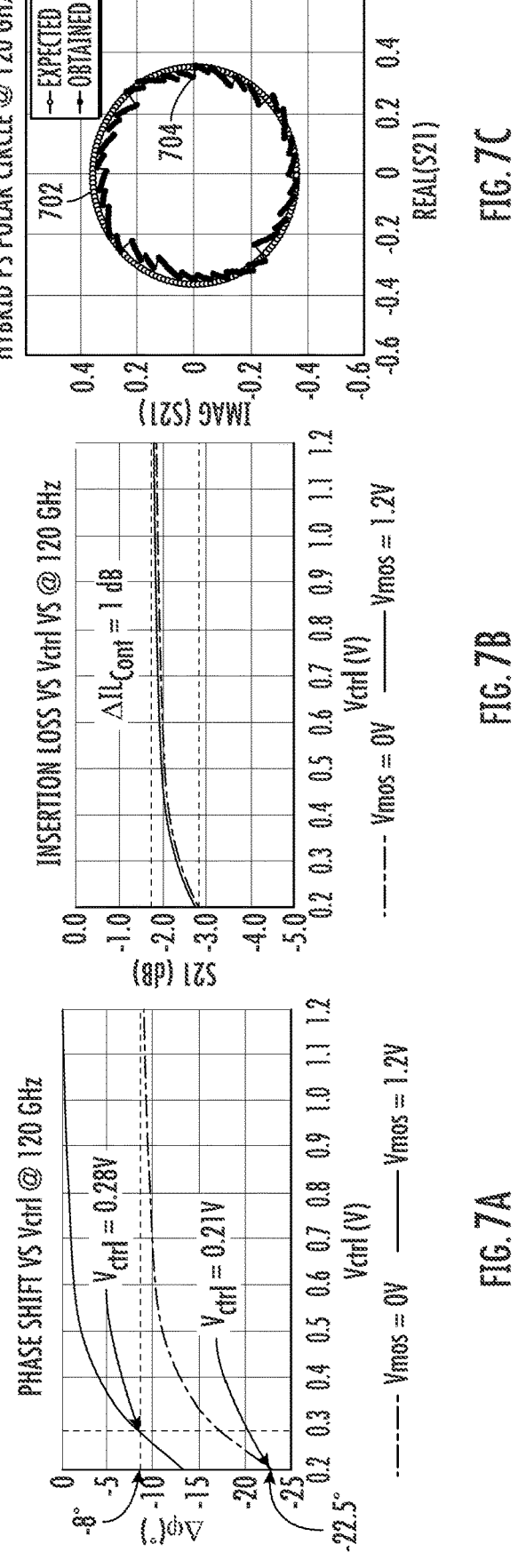

PHASE SHIFTERS WITH LOW AMPLITUDE VARIATION

TECHNOLOGICAL FIELD

Example embodiments of the present disclosure relate generally to phase shifters, and more particularly to systems and methods for high resolution phase shifters.

BACKGROUND

Phase shifters are used in various technologies for example in wireless communications systems. New developments in the technologies that use phase shifting require the phase shifters to have improved performance. Applicant has identified many technical challenges and difficulties associated with phase shifters. Through applied effort, ingenuity, and innovation, Applicant has solved problems related to phase shifters by developing solutions embodied in the present disclosure, which are described in detail below.

BRIEF SUMMARY

Various embodiments described herein relate to systems, apparatuses, products, and methods for phase shifting. In an embodiment, a phase shifter is provided. In various embodiments, the phase shifter includes a plurality of digital phase shifters, each digital phase shifter of the plurality of the digital phase shifters configured to vary a phase of a phase shifter input signal by a corresponding phase shift value, and a continuous phase shifter configured to vary the phase of the phase shifter input signal with a variable phase shift value. In various embodiments, the continuous phase shifter comprises a continuous phase shifter load configured to receive a control voltage and vary the variable phase shift value using the control voltage.

In various embodiments, the corresponding phase shift value to each of the digital phase shifters remains at approximately a corresponding low digital phase shift value when a switch of the digital phase shifter is on and remains at approximately a corresponding high digital phase shift value when a switch of the digital phase shifter is off. In various embodiments, the variable phase shift value varies between a minimum continuous phase shift value and a maximum continuous phase shift value, wherein the difference between the maximum and the minimum continuous phase shift value is a minimum of the corresponding phase shift values provided by the digital phase shifters.

In various embodiments, the plurality of digital phase shifters and the continuous phase shifter are electrically coupled to each other in series. In various embodiments, a sum of each of the corresponding phase shift values to the digital phase shifters and a maximum variable phase shift value is about 360°.

In various embodiments, the continuous phase shifter load includes a first electrical component having a capacitance, wherein the capacitance of the first electrical component is configured to vary in response to the control voltage and a second electrical component having an inductance. In various embodiments, the second electrical component is electrically coupled to the first electrical component in parallel.

In various embodiments, the continuous phase shifter is configured to vary the variable phase shift value between a minimum variable phase shift to a maximum variable phase shift value by varying the control voltage from a minimum control voltage to a maximum control voltage value. In various embodiments, the continuous phase shifter is a Reflective-Type Phase Shifter (RTPS).

In various embodiments, the second electrical component includes a switched inductor configured to have a first inductance and a second inductance in response to a state of a switch.

In various embodiments, the switched inductor includes a first inductor including a first inductive strip and a first port, wherein a first pin of the first port is electrically coupled to the first electrical component and a second pin of the first port is electrically coupled to a circuit ground, and a second inductor including a second inductive strip disposed in a way to be electromagnetically coupled with the first inductive strip a second port and the switch electrically coupled to a first pin of the second port and a second pin of the second port.

In various embodiments, the switch is configured to create an open circuit in the second port when the switch is in an off state and create a short circuit in the second port when the switch is in an on state wherein an inductance of the switched inductor is lowered when the switch is in the on state compared to when the switch is in the off state.

In various embodiments, the continuous phase shifter is configured to vary the variable phase shift value between about a minimum variable phase shift value and an intermediate variable phase shift value, by varying the control voltage between a maximum control voltage value and an intermediate control voltage when the switch is in the on state and vary the variable phase shift value between the intermediate variable phase shift value and a maximum variable phase shift value, by varying the control voltage between the maximum control voltage value and a lower control voltage value when then switch is in the off state. In various embodiments, the intermediate control voltage value is greater than the lower control voltage value and the lower control voltage value is greater than a minimum control voltage, and wherein the intermediate variable phase shift value is greater than the minimum variable phase shift value and less than the maximum variable phase shift value.

In various embodiments, the continuous phase shifter is configured to vary an insertion loss of the phase shifter between a lower insertion loss and a new upper insertion loss when varying the variable phase shift value between about zero and the maximum variable phase shift value.

Various embodiments of the present disclosure provide a phase shifter. The phase shifter may include a first digital phase shifter configured to vary a phase of a phase shifter input signal by a first phase shift value, a second digital phase shifter configured to vary the phase of the phase shifter input signal by a second phase shift value, a third digital phase shifter configured to vary the phase of the phase shifter input signal by a third phase shift value, a fourth digital phase shifter configured to vary the phase of the phase shifter input signal by a fourth phase shift value, a continuous phase shifter configured to vary the phase of the phase shifter input signal with a variable phase shift value, and a continuous phase shifter load configured to receive a control voltage and vary the variable phase shift value using the control voltage.

In various embodiments, the first phase shift value provided by the first digital phase shifter remains at approximately a first low digital phase shift value when a switch of the first digital phase shifter is on and remains at approximately a corresponding high first digital phase shift value when a switch of the first digital phase shifter is off. In various embodiments, the second phase shift value provided by the second digital phase shifter remains at approximately a second low digital phase shift value when a switch of the second digital phase shifter is on and remains at approximately a corresponding high second digital phase shift value when a switch of the second digital phase shifter is off. In various embodiments, the third phase shift value provided by the third digital phase shifter remains at approximately a third low digital phase shift value when the third digital phase shifter is on and remains at approximately a corresponding high third digital phase shift value when a switch of the third digital phase shifter is off. In various embodiments, the fourth phase shift value provided by the fourth digital phase shifter remains at approximately a fourth low digital phase shift value when the fourth digital phase shifter is on and remains at approximately a corresponding high fourth digital phase shift value when a switch of the fourth digital phase shifter is off. In various embodiments, the variable phase shift value varies between about zero and a minimum of the phase shift values provided by the first, second, third, or fourth digital phase shifters.

In various embodiments, the first digital phase shifter, the second digital phase shifter, the third digital phase shifter, the fourth digital phase shifter, and the continuous phase shifter are electrically coupled to each other in series.

In various embodiments, a sum of the first phase shift value, the second phase shift value, the third phase shift value, and the fourth phase shift value when the corresponding digital phase shifter is on, and a maximum variable phase shift value is about 360°.

In various embodiments, the first phase shift value when the first digital phase shifter is on is about 22.5°, the second phase shift value when the second digital phase shifter is on is about 45°, the third phase shift value when the third digital phase shifter is on is about 90°, and the fourth phase shift value when the fourth digital phase shifter is on is about 180°, and a maximum variable phase shift value is about 22.5°.

Various embodiments of the present disclosure provide a continuous phase shifter that includes a continuous phase shifter load. The continuous phase shifter load may include a first electrical component having a capacitance, wherein the capacitance of the first electrical component is configured to vary in response to a control voltage and a second electrical component having an inductance, wherein the second electrical component is electrically coupled to the first electrical component in parallel and comprises a switched inductor configured to have a first inductance and a second inductance in response to a state of a switch.

In various embodiments, the switched inductor includes a first inductor including a first inductive strip and a first port, wherein a first pin of the first port is electrically coupled to the first electrical component and a second pin of the first port is electrically coupled to a circuit ground, and a second inductor including a second inductive strip disposed in parallel to the first inductive strip, a second port, and the switch electrically coupled to a first pin of the second port and a second pin of the second port, wherein the switch is configured to create an open circuit in the second port when the switch is in an off state, and create a short circuit in the second port when the switch is in an on state, wherein an inductance of the inductor is lowered when the switch is in the on state compared to when the switch is in the off state.

In various embodiments, the continuous phase shifter is configured to vary the variable phase shift value between about a minimum variable phase shift and an intermediate variable phase shift value, by varying the control voltage between a maximum control voltage value and an intermediate control voltage when the switch is in the on state, and vary the variable phase shift value between the intermediate variable phase shift value and a maximum variable phase shift value, by varying the control voltage between the maximum control voltage value and a lower control voltage value when then switch is in the off state, wherein the intermediate control voltage value is greater than the lower control voltage value and the lower control voltage value is greater than a minimum control voltage, and wherein the intermediate variable phase shift value is greater than the minimum variable phase shift and less than the maximum variable phase shift value and the continuous phase shifter is configured to vary an insertion loss of the phase shifter between a lower insertion loss and a new upper insertion loss when varying the variable phase shift value between the minimum variable phase shift and the maximum variable phase shift value.

The above summary is provided merely for purposes of summarizing some example embodiments to provide a basic understanding of some aspects of the disclosure. Accordingly, it will be appreciated that the above-described embodiments are merely examples and should not be construed to narrow the scope or spirit of the disclosure in any way. It will also be appreciated that the scope of the disclosure encompasses many potential embodiments in addition to those here summarized, some of which will be further described below.

BRIEF SUMMARY OF THE DRAWINGS

Figure 1:
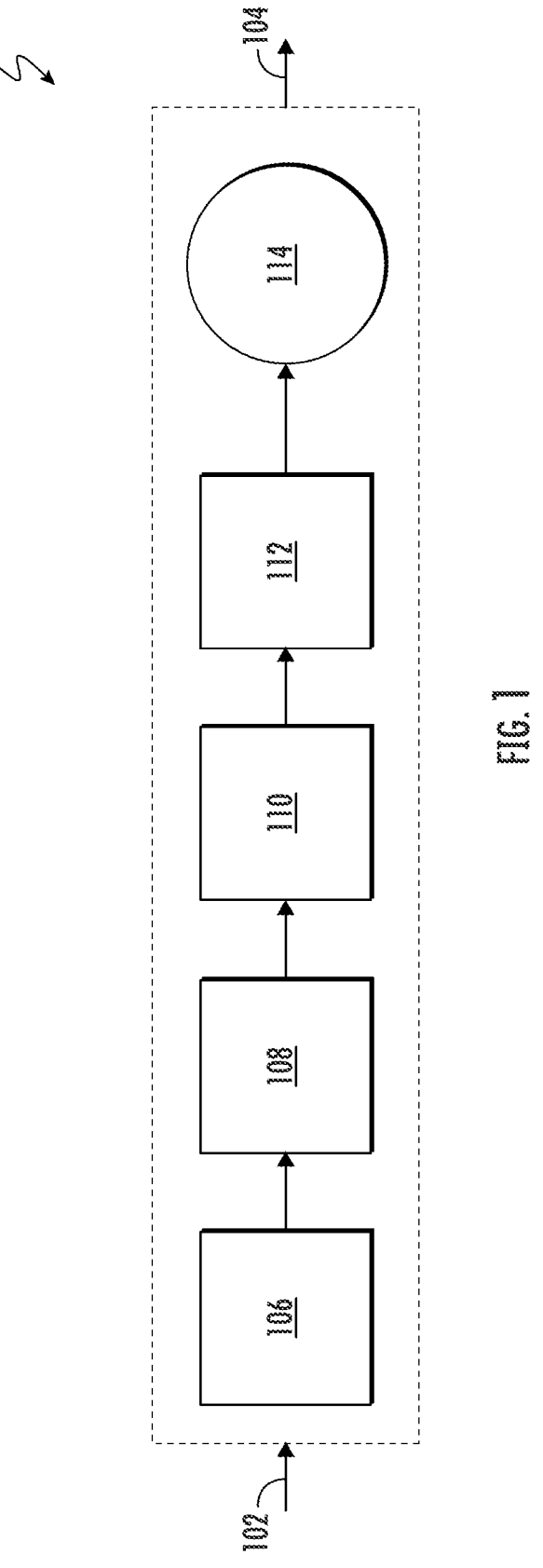
Figure 2:
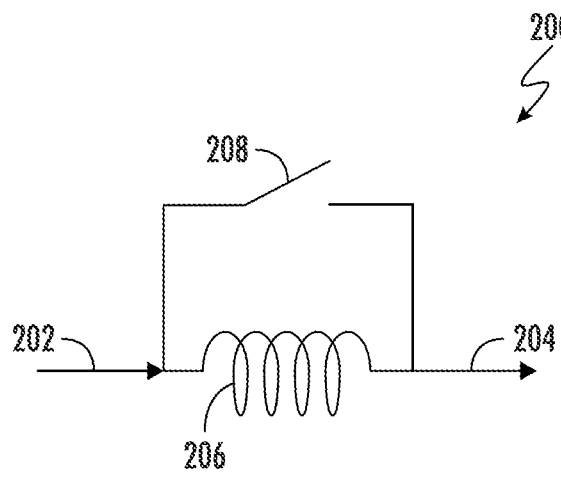
Figure 3:
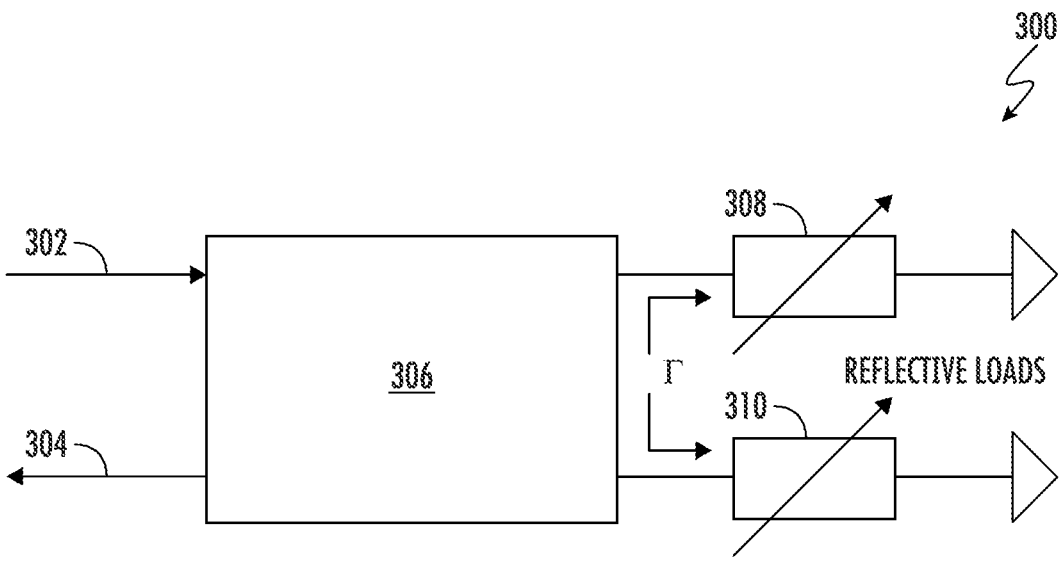
Figure 6A:
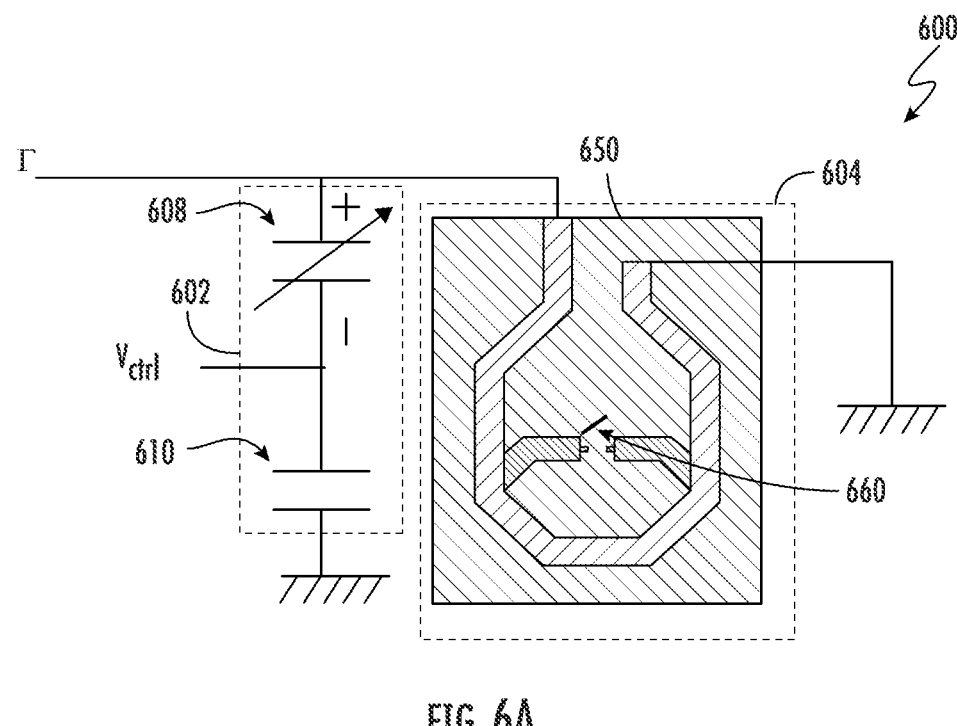
Figure 6B:
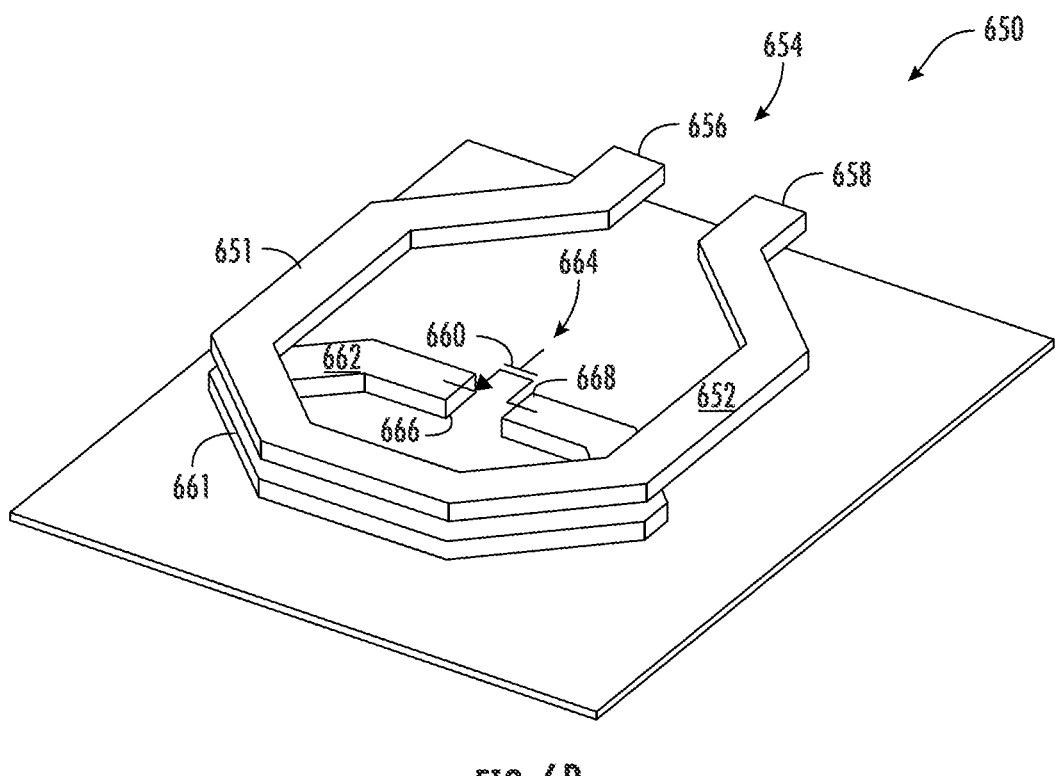
Figure 8:
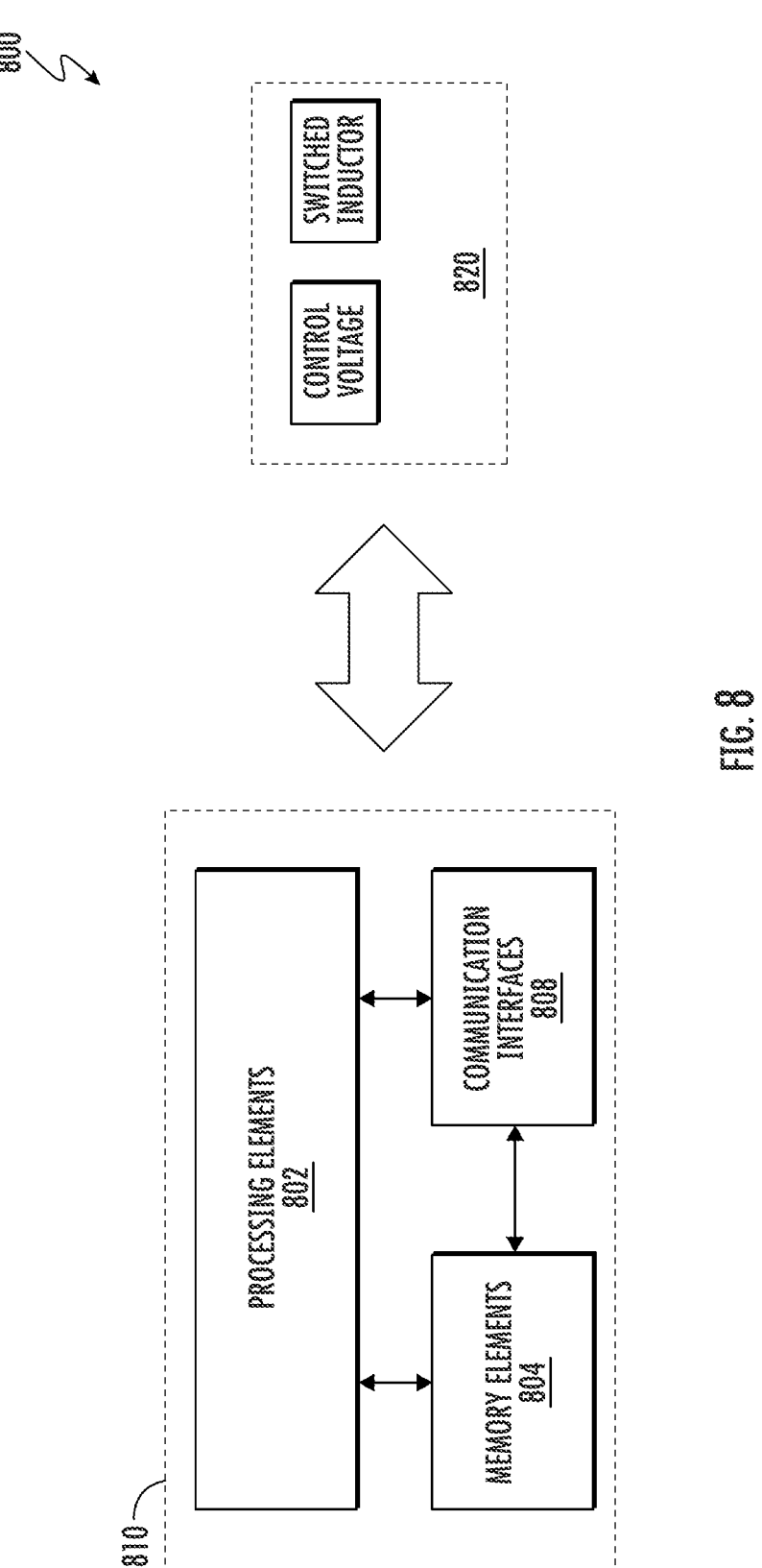

Having thus described certain example embodiments of the present disclosure in general terms, reference will now be made to the accompanying drawings, which are not necessarily drawn to scale, and wherein:

FIG. 1 is a schematic diagram illustrating a phase shifter in accordance with one or more embodiments of the present disclosure;

FIG. 2 is a schematic diagram illustrating a phase shifter in accordance with one or more embodiments of the present disclosure;

FIG. 3 is a schematic diagram illustrating a phase shifter in accordance with one or more embodiments of the present disclosure;

FIG. 4 is a schematic diagram illustrating a phase shifter load in accordance with one or more embodiments of the present disclosure;

FIGS. 5A-5C are diagrams illustrating various parameters related to phase shifters in accordance with one or more embodiments of the present disclosure;

FIG. 6A is a schematic diagram illustrating a phase shifter load in accordance with one or more embodiments of the present disclosure;

FIG. 6B is a schematic diagram illustrating a switched inductor in accordance with one or more embodiments of the present disclosure;

FIGS. 7A-7C are diagrams illustrating various parameters related to phase shifters in accordance with one or more embodiments of the present disclosure;

FIG. 8 illustrates an example computing apparatus in accordance with one or more embodiments of the present disclosure.

DETAILED DESCRIPTION

Embodiments of the present disclosure will now be described more fully herein with reference to the accompanying drawings, in which some, but not all, embodiments of the disclosure are shown. Indeed, various embodiments of the disclosure may be embodied in many different forms and should not be construed as limited to the embodiments set forth herein; rather, these embodiments are provided so that this disclosure will satisfy applicable legal requirements. Like reference numerals refer to like elements throughout.

Various embodiments of the present disclosure are directed to improved systems, apparatuses, products, and methods for phase shifting, for example by using passive phase shifters where various modules or components of the phase shifters include passive electrical elements. In various embodiments, the phase shifters as provided herein are implemented using various silicon-based technologies such as CMOS, BiCMOS, for example 55 nm BiCMOS.

Various embodiments provide phase shifting from 0° to 360° at high frequencies, for example at frequencies above 80 GHz. At high frequencies, in various approaches that has been used for phase shifting, the insertion loss of the phase shifter increases and varies based on the amount of phase shifting provided. High insertion loss is undesirable because it reduces efficiency of the phase shifter. Additionally, when the insertion loss varies significantly based on the provided phase shift, the output amplitude also varies significantly based on the provided phase shift which may be undesirable.

In various examples, embodiments of the present disclosure provide low insertion loss and low variation of the insertion loss with respect to phase, and therefore low amplitude variation while providing phase shifting from 0° to 360° at high frequencies.

Referring now to FIG. 1, a schematic diagram illustrating a phase shifter 100 is provided in accordance with various embodiments of the present disclosure. The phase shifter 100 includes one or more digital phase shifters. For example, the phase shifter 100 may include a first digital phase shifter 106, a second digital phase shifter 108, a third digital phase shifter 110, and a fourth digital phase shifter 112.

Each digital phase shifter may be configured to provide a phase shift depending on the state of the switch used in the circuit. The digital phase shifters may vary the phase of an input signal to the digital phase shifter depending on the state of a switch. The digital phase shifter may therefore have two different phase shifting states: a state of constant low phase shift (generally corresponding to when the switch is on) and a state of constant high phase shift (generally corresponding to when the switch is off). Thus, the phase shift required from the digital phase shifter corresponds to the difference between the low and the high phase shift.

For example the first digital phase shifter 106 may be configured to vary a phase of a phase shifter input signal 102 by a first phase shift value, the second digital phase shifter 108 may be configured to vary the phase of the phase shifter input signal 102 by a second phase shift value, the third digital phase shifter 110 may be configured to vary the phase of the phase shifter input signal by a third phase shift value, and the fourth digital phase shifter 112 may be configured to vary the phase of the phase shifter input signal by a fourth phase shift value, when each corresponding phase shifter is on.

In various embodiments, the first phase shift provided by the first digital phase shifter is constant and corresponds to the phase difference in an output of the first phase shifter when the first digital phase shifter is on (reference state) and when the first digital phase shifter is off. In various embodiments, the second phase shift provided by the second digital phase shifter is constant and corresponds to the phase difference in an output of the second phase shifter when the second digital phase shifter is on (reference state) and when the second digital phase shifter is off. In various embodiments, the third phase shift provided by the third digital phase shifter is constant and corresponds to the phase difference in an output of the third phase shifter when the third digital phase shifter is on (reference state) and when the third digital phase shifter is off. In various embodiments, the fourth phase shift provided by the fourth digital phase shifter is constant and corresponds to the phase difference in an output of the fourth phase shifter when the fourth digital phase shifter is on (reference state) and when the fourth digital phase shifter is off.

In various embodiments, the phase shifter 100 includes a continuous phase shifter 114. The continuous phase shifter 114 may be configured to vary the phase of the phase shifter input signal 102 with a variable phase shift value.

In various embodiments, the corresponding phase shift value to each of the digital phase shifters is constant and is the difference between the low phase shift when the first digital phase shifter is on and the high phase shift when the first digital phase shifter is off. Therefore, when the state of a digital phase shifter changes, it shifts the phase of the phase shifter input signal 102 with the constant phase shift value corresponding to the digital phase shifter.

In various embodiments, the variable phase shift value provided by the continuous phase shifter 114 varies between about a minimum variable phase shift (which for example may be approximately zero) and a minimum of the corresponding phase shift values provided by the digital phase shifters. For example, referring to FIG. 1, the difference between the maximum and the minimum of the variable phase shift value provided by the continuous phase shifter 114 may be the minimum of the first phase shift value, the second phase shift value, the third phase shift value, and the fourth phase shift value.

In various embodiments, a sum of each the corresponding phase shift values to the digital phase shifters and a maximum variable phase shift value is about 360°. In various embodiments, the corresponding phase shift value to each digital phase shifter may correspond to the difference between a maximum and a minimum phase shift for the digital phase shifter. For example, referring to FIG. 1, a sum of the first phase shift value, the second phase shift value, the third phase shift value, and the fourth phase shift value (each provided by the corresponding digital phase shifters when they are on) and the difference between the maximum and the minimum of the variable phase shift value (provided by the continuous phase shifter when providing its maximum variable phase shift value) is about 360°.

In various embodiments, a phase of the phase shifter output signal 104 is a sum of the phase shift values provided by any of the digital phase shifters that are on, and the variable phase shift provided by the continuous phase shifter 114. In various embodiments, the digital phase shifters and the continuous phase shifter are electrically coupled to each other in series.

In example embodiments, the phase difference for the first digital phase shifter 106 is about 22.5°, the phase difference for the second digital phase shifter 108 is about 45°, the phase difference for the third digital phase shifter 110 is about 90°, and the phase difference for the fourth digital phase shifter 112 is about 180° and the variable phase shift value provided by the continuous phase shifter 114 is between 0° to about 22.5°.

Referring now to FIG. 2, a schematic diagram illustrating a digital phase shifter 200 is provided in accordance with various embodiments of the present disclosure. In various embodiments, the digital phase shifter 200 is a Switched- Type Phase Shifter (STPS) digital phase shifter. The digital phase shifter 200 may include an inductor 206 and a switch 208. By turning a switch 208 between to an off state, the digital phase shifter 200 will be in an off state and vary a phase of the input 202 to the digital phase shifter 200 and generate a phase shifted output 204 of the digital phase shifter 200. When the switch 208 is in an on state, the inductor 206 is bypassed and the digital phase shifter 200 Is in an on state, and approximately zero phase shift is provided to the input 202 to generate the output 204. With reference to FIG. 1, in example embodiments, the first digital phase shifter 106 may be an STPS digital phase shifter. However, at high frequencies such as above 80 GHz, there may be a non-negligible phase shift when the switch 208 is on. Therefore, in various embodiments herein and as previously described, a difference between two phase shifting states may be used for providing the digital phase shifting at various other digital phase shifting stages.

Referring now to FIG. 3 a schematic diagram illustrating a phase shifter 300 is provided in accordance with various embodiments of the present disclosure. The phase shifter 300 may be a Reflective-Type Phase Shifter (RTPS). In various embodiments, an input 302 and an output 304 of the phase shifter 300 are inputs and outputs of a coupler 306. In example embodiments, the coupler 306 is a 3-dB coupler.

In various embodiments, the coupler 306 is electrically coupled to reflective loads 308 and 310. Any of the reflective loads may have the load reflection coefficient Γ. In various embodiments, the phase shifter 300 may be a digital phase shifter or a continuous phase shifter. For example, by using a switch in the reflective loads, the phase shifter 300 may function as a digital phase shifter. In an example, by varying an electrical property of any of the loads, the phase shifter 300 may function as a continuous phase shifter.

Referring now to FIG. 4 a schematic diagram illustrating a continuous phase shifter load 400 is provided in accordance with various embodiments of the present disclosure. In various embodiments, the continuous phase shifter includes the continuous phase shifter load 400. The continuous phase shifter load 400 may include a first electrical component 402 and a second electrical component 404. The second electrical component 404 may be electrically coupled to the first electrical component 402 in parallel. The continuous phase shifter load 400 may be configured to receive a control voltage Vctrl.

The first electrical component 402 may have a capacitance. For example, the first electrical component 402 may include a variable capacitor 408. In various embodiments, a capacitance of the variable capacitor 408 varies in response to the control voltage Vctrl. The variable capacitor 408 may for example be a varactor which is an electrical element that has a variable capacitance determined by a control voltage applied to it. The first electrical component 408 may also include a shunt capacitor 410.

In various embodiments, the second electrical component 404 has an inductance property. For example, the second electrical component 404 may include an electrical element 406 having an impedance including an inductance. In various embodiments, the electrical element 406 includes or is an inductor.

Referring now to FIG. 5A a diagram illustrating the phase shift provided by a continuous phase shifter is provided in accordance with various embodiments of the present disclosure. In various embodiments, by varying the capacitance of the first electrical component 402 using the control voltage, the variable phase shift value provided by the continuous phase shifter is varied. The continuous phase shifter may be configured to vary the variable phase shift value between a minimum variable phase shift value (for example about zero) to a maximum variable phase shift value by varying the control voltage from a minimum control voltage to a maximum control voltage value. For example, by varying the control voltage Vctrl from about-1.2V to about 1.2V, the variable phase shift provided by the continuous phase shifter 114 may be varied from about 0° to about 22.5°.

Referring now to FIG. 5B a diagram illustrating the insertion loss provided by a continuous phase shifter is provided in accordance with various embodiments of the present disclosure. The continuous phase shifter may be configured to vary an insertion loss of the phase shifter between a lower insertion loss to an upper insertion loss when varying the variable phase shift from the minimum variable phase shift value to the maximum variable phase shift value.

In various embodiments, varying the variable phase shift value may be done, at least in part, using the control voltage. For example, as illustrated by FIG. 5A, varying the control voltage from about 1.2V to about 0V may vary the variable phase shift value from about 0° to about 22.5° at an operation frequency of about 120 GHz. Consequently, the insertion loss of the continuous phase shifter may vary for example by 1.5 dB from a lower insertion loss of about-1.9 dB to an upper insertion loss of about-3.5 dB when varying the control voltage from about 1.2V to about 0V, according to an example.

Referring now to FIG. 5C, a schematic diagram illustrating variations in the transfer function of a continuous phase shifter is provided in accordance with various embodiments of the present disclosure. The transfer function ($S_{21}$) may correspond to the energy loss caused by the continuous phase shifter. Therefore, by illustrating the imaginary component versus the real component of the transfer function, FIG. 5C illustrates the amplitude variation caused as a result of the variation in the insertion loss. Graph 502 illustrates variation in the transfer function in an ideal scenario where the insertion loss does not vary as the variable phase shift value varies.

However, in various embodiments, as the variable phase shift value provided by the continuous phase shifter changes, the insertion loss and therefore the amplitude of the continuous phase shifter's output varies. Graph 504 illustrates amplitude variations in the continuous phase shifter's output in accordance with various embodiments of the present disclosure where the control voltage is used to vary the variable phase shift with reference to FIG. 4.

Referring now to FIG. 6A a schematic diagram illustrating a continuous phase shifter load 600 is provided in accordance with various embodiments of the present disclosure. In various embodiments, the continuous phase shifter 600 includes the continuous phase shifter load 600. The continuous phase shifter load 600 may include a first electrical component 602 and a second electrical component 604. The second electrical component 604 may be electrically coupled to the first electrical component 602 in parallel. The continuous phase shifter load 600 may be configured to receive a control voltage Vctrl.

In various embodiments, similar to load 400, the first electrical component 602 may have a capacitance. For example, the first electrical component 602 may include a variable capacitor 608. In various embodiments, a capacitance of the variable capacitor 608 varies in response to the control voltage Vctrl. The variable capacitor 608 may for example be a varactor which is an electrical element that has a variable capacitance determined by a control voltage applied to it. The first electrical component 608 may also include a shunt capacitor 610.

In various embodiments, the second electrical component 604 has an inductance property. For example, the second electrical component 604 may include a switched inductor 650. The switched inductor 650 may be configured to have a first inductance and a second inductance in response to a state of a switch 660. The switch 660 may be a MOS switch.

Referring now to FIG. 6B a schematic diagram illustrating the switched inductor 650 is provided in accordance with various embodiments of the present disclosure. In various embodiments, the switched inductor 650 includes a first inductor 651 comprising a first inductive strip 652, and a first port 654. In various embodiments, a first pin 656 of the first port 654 is electrically coupled to the first electrical component 602 and a second pin 658 of the first port 654 is electrically coupled to a circuit ground.

In various embodiments, the switched inductor 650 includes a second inductor 661 comprising a second inductive strip 662 disposed in a way to be electromagnetically coupled to the first inductive strip 652. The second inductor 661 includes a second port 664. The switch 660 may be electrically coupled to a first pin 666 of the second port 664 and a second pin 668 of the second port 664.

In various embodiments, the switch 660 is configured to create an open circuit in the second port 664 when the switch is in an off state and create a short circuit in the second port 664 when the switch is in an on state. An inductance of the switched inductor 650 is lowered when the switch 660 is in the on state compared to when the switch 660 is in the off state.

In various embodiments, with reference to FIG. 1, the continuous phase shifter 114 includes the continuous phase shifter load 600 having the switched inductor 650. In various embodiments, the continuous phase shifter using the continuous phase shifter load 600 is configured to vary the variable phase shift value by varying the control voltage and by varying the inductance of the phase shifter load by placing the switch 660 in the on or off state.

In various embodiments, when the switch 660 is in the on state, the variable phase shift value is varied between approximately a minimum variable phase shift value and an intermediate variable phase shift value by varying the control voltage between a maximum control voltage value and an intermediate control voltage.

In various embodiments, when the switch 660 is in the off state, the variable phase shift value is varied between the intermediate variable phase shift value and a maximum variable phase shift value, by varying the control voltage between the maximum control voltage value and a lower control voltage value.

In various embodiments, the intermediate control voltage value is greater than the lower control voltage value and the lower control voltage value is greater than the minimum control voltage, and the intermediate variable phase shift value is greater than the minimum variable phase shift and less than the maximum variable phase shift value.

Referring now to FIG. 7A a diagram illustrating the phase shift provided by a continuous phase shifter using the switched inductor in the continuous phase shifter load is provided in accordance with various embodiments of the present disclosure.

In an example embodiment, the intermediate variable phase shift value is about −8°, the maximum control voltage is 1.2V and the intermediate control voltage is 0.28V. When the switch 660 is in the on state (for example when applying the voltage 1.2V to a MOS switch 660 as shown by the solid graph in FIG. 7A), the control voltage may be varied from about 1.2V to about 0.28V and the variable phase shift value may vary from about 0° to about −8°.

Further decreasing the control voltage below the intermediate control voltage value (0.28V in the example illustrated in FIG. 7A), continues to increase the variable phase shift value, however at a higher rate. Such high rate of change in the variable phase shift value may result in higher variation of insertion loss, hence higher amplitude variation. However, in various embodiments herein, after the control voltage reaches the intermediate control voltage, the switch 660 is turned off and the variation in the variable phase shift value continues to occur by changing the control voltage from the maximum control voltage (e.g. 1.2V) to the lower control voltage value (0.2V in the example of FIG. 7A). In example embodiments, doing so provides variation of the variable phase shift value from the variable phase shift value (e.g. −8°) to the maximum variable phase shift value (e.g. −22.5° on the dotted line shown in the example of FIG. 7A). Doing so may result in lower variation in insertion loss, hence lower amplitude variation in the output of the continuous phase shifter.

In various embodiments, by varying the capacitance of the first electrical component 602 using the control voltage and by varying the inductance of the continuous phase shifter load 600, the variable phase shift value provided by the continuous phase shifter is varied.

Referring now to FIG. 7B a diagram illustrating the insertion loss provided by a continuous phase shifter is provided in accordance with various embodiments of the present disclosure. The continuous phase shifter is configured to vary an insertion loss of the phase shifter between a lower insertion loss and a new upper insertion loss when varying the variable phase shift value between the minimum variable phase shift value and the maximum variable phase shift value. In example embodiments, the new upper insertion loss is higher than the upper insertion loss with reference to FIG. 5B, therefore the variation in the insertion loss and consequently the output amplitude variation may be reduced when using the switched inductor 650.

In various embodiments, varying the variable phase shift value may be done, at least in part, using the control voltage and the switch 660. Consequently, the insertion loss of the continuous phase shifter may vary for example by 1 dB from a lower insertion loss of about −1.9 dB to a new upper insertion loss of about −3 dB.

Referring now to FIG. 7C, a schematic diagram illustrating variations in the transfer function of a continuous phase shifter is provided in accordance with various embodiments of the present disclosure. The transfer function ($S_{21}$) may correspond to the energy loss caused by the continuous phase shifter. Therefore, by illustrating the imaginary component versus the real component of the transfer function, FIG. 7C illustrates the amplitude variation caused as a result of the variation in the insertion loss when both voltage control and switch 660 are used to determine the variable phase value as described above. Graph 702 illustrates variation in the transfer function in an ideal scenario where the insertion loss does not vary as the variable phase shift value varies.

However, in various embodiments, as the variable phase shift value provided by the continuous phase shifter changes, the insertion loss and therefore the amplitude of the continuous phase shifter's output varies. Graph 704 illustrates amplitude variations in the continuous phase shifter's output in accordance with various embodiments of the present disclosure where the control voltage and switch 660 are used to vary the variable phase shift with reference to FIG. 6A. Comparing FIG. 7C with FIG. 5C, it can be seen that there is less amplitude variation when both the control voltage and the switch 660 are used to determine the variable phase shift of a continuous phase shifter.

It should be readily appreciated that the embodiments of the systems, apparatus, and methods described herein may be configured in various additional and alternative manners in addition to those expressly described herein.

FIG. 8 illustrates an example phase shifting system 800 in accordance with one or more embodiments of the present disclosure.

The phase shifting system 800 can include a computing apparatus 810 and/or one or more phase shifters 820 communicatively coupled to the computing apparatus 810 using one or more wired and/or wireless communication techniques. In general, the terms computing apparatus, computer, system, device, entity, and/or similar words used herein interchangeably can refer to, for example, one or more computers, computing entities, desktops, mobile phones, tablets, notebooks, laptops, distributed systems, kiosks, input terminals, servers or server networks, blades, gateways, switches, processing devices, processing entities, controllers, control systems, set-top boxes, relays, routers, network access points, base stations, the like, and/or any combination of devices or entities adapted to perform the functions, operations, and/or processes described herein. Such functions, operations, and/or processes can include, for example, transmitting, receiving, operating on, processing, displaying, storing, determining, creating/generating, monitoring, evaluating, comparing, and/or similar terms used herein interchangeably. In one embodiment, these functions, operations, and/or processes can be performed on data, content, information, and/or similar terms used herein interchangeably. The computing apparatus 810 can include any computing device including, for example, a phase shifting processing apparatus configured to perform one or more steps/operations of one or more phase shifting techniques described herein. In some embodiments, the computing apparatus 810 can include and/or be in association with one or more mobile device(s), desktop computer(s), laptop(s), server(s), cloud computing platform(s), and/or the like. In some example embodiments, the computing apparatus 810 can be configured to receive and/or transmit phase shifting instructions, data, and/or the like between the one or more phase shifters 820 to perform one or more steps/operations of one or more phase shifting techniques described herein.

The phase shifters 820, for example, can include and/or be associated with one or more phase shifting devices. The one or more phase shifting devices, for example, can include one or more sub phase shifting components configured to output and/or receive phase shifting data. By way of example, the sub phase shifting can include one or more digital phase shifter(s), continuous phase shifter(s), and/or the like. In some example embodiments, the phase shifters 820 can be configured to receive and/or transmit phase shifting instructions, data, and/or the like from/to the computing apparatus 810 to perform one or more steps/operations of one or more phase shifting techniques described herein. In some embodiments, the phase shifters 820 can include phase shifting specific components to facilitate one or more phase shifting techniques. As described herein, one or more phase shifting techniques of the present disclosure can be implemented with any external computing apparatuses including those with phase shifting specific components and those without phase shifting specific components.

The computing apparatus 810 can include, or be in communications with, one or more processing elements 802 (also referred to as processors, processing circuitry, digital circuitry, and/or similar terms used herein interchangeably) that communicate with other elements within the computing apparatus 810 via a bus, for example. As will be understood, the processing element 802 can be embodied in a number of different ways.

For example, the processing element 802 can be embodied as one or more complex programmable logic devices (CPLDs), microprocessors, multi-core processors, coprocessing entities, application-specific instruction-set processors (ASIPs), microcontrollers, and/or controllers. Further, the processing element 802 can be embodied as one or more other processing devices or circuitry. The term circuitry can refer to an entirely hardware embodiment or a combination of hardware and computer program products. Thus, the processing element 802 can be embodied as integrated circuits, application specific integrated circuits (ASICs), field programmable gate arrays (FPGAs), programmable logic arrays (PLAs), hardware accelerators, digital circuitry, and/or the like.

As will therefore be understood, the processing element 802 can be configured for a particular use or configured to execute instructions stored in volatile or non-volatile media or otherwise accessible to the processing element 802. As such, whether configured by hardware or computer program products, or by a combination thereof, the processing element 802 can be capable of performing steps or operations according to embodiments of the present disclosure when configured accordingly.

In one embodiment, the computing apparatus 810 can further include, or be in communication with, one or more memory elements 804. The one or more memory elements 804 can include non-volatile and/or volatile media. The memory elements 804, for example, can include non-volatile media (also referred to as non-volatile storage, memory, memory storage, memory circuitry and/or similar terms used herein interchangeably). In one embodiment, the non-volatile storage or memory can include one or more non-volatile storage or memory media, including, but not limited to, hard disks, ROM, PROM, EPROM, EEPROM, flash memory, MMCs, SD memory cards, Memory Sticks, CBRAM, PRAM, FeRAM, NVRAM, MRAM, RRAM, SONOS, FJG RAM, Millipede memory, racetrack memory, and/or the like.

As will be recognized, the non-volatile storage or memory media can store databases, database instances, database management systems, data, applications, programs, program modules, scripts, source code, object code, byte code, compiled code, interpreted code, machine code, executable instructions, and/or the like. The term database, database instance, database management system, and/or similar terms used herein interchangeably can refer to a collection of records or data that is stored in a computer-readable storage medium using one or more database models, such as a hierarchical database model, network model, relational model, entity-relationship model, object model, document model, semantic model, graph model, and/or the like.

In addition, or alternatively, the memory elements 804 can include volatile memory. For example, the computing apparatus 810 can further include, or be in communication with, volatile media (also referred to as volatile storage memory, memory storage, memory circuitry and/or similar terms used herein interchangeably). In one embodiment, the volatile storage or memory can also include one or more volatile storage or memory media, including, but not limited to, RAM, DRAM, SRAM, FPM DRAM, EDO DRAM, SDRAM, DDR SDRAM, DDR2 SDRAM, DDR3 SDRAM, RDRAM, TTRAM, T-RAM, Z-RAM, RIMM, DIMM, SIMM, VRAM, cache memory, register memory, and/or the like.

As will be recognized, the volatile storage or memory media can be used to store at least portions of the databases, database instances, database management systems, data, applications, programs, program modules, scripts, source code, object code, byte code, compiled code, interpreted code, machine code, executable instructions, and/or the like being executed by, for example, the processing element 802. Thus, the databases, database instances, database management systems, data, applications, programs, program modules, scripts, source code, object code, byte code, compiled code, interpreted code, machine code, executable instructions, and/or the like can be used to control certain aspects of the operation of the computing apparatus 810 with the assistance of the processing element 802 and operating system.

As indicated, in one embodiment, the computing apparatus 810 can also include one or more communication interfaces 808 for communicating with various computing entities, such as by communicating data, content, information, and/or similar terms used herein interchangeably that can be transmitted, received, operated on, processed, displayed, stored, and/or the like. Such communication can be executed using a wired data transmission protocol, such as fiber distributed data interface (FDDI), digital subscriber line (DSL), Ethernet, asynchronous transfer mode (ATM), frame relay, data over cable service interface specification (DOC-SIS), or any other wired transmission protocol. Similarly, the computing apparatus 810 can be configured to communicate via wireless external communication networks using any of a variety of protocols, such as general packet radio service (GPRS), Universal Mobile Telecommunications System (UMTS), Code Division Multiple Access 2000 (CDMA2000), CDMA2000 1× (1×RTT), Wideband Code Division Multiple Access (WCDMA), Global System for Mobile Communications (GSM), Enhanced Data rates for GSM Evolution (EDGE), Time Division-Synchronous Code Division Multiple Access (TD-SCDMA), Long Term Evolution (LTE), Evolved Universal Terrestrial Radio Access Network (E-UTRAN), Evolution-Data Optimized (EVDO), High Speed Packet Access (HSPA), High-Speed Downlink Packet Access (HSDPA), IEEE 802.9 (Wi-Fi), Wi-Fi Direct, 802.16 (WiMAX), ultra-wideband (UWB), infrared (IR) protocols, near field communication (NFC) protocols, Wibree, Bluetooth protocols, wireless universal serial bus (USB) protocols, and/or any other wireless protocol.

The phase shifting system 800 can include input/output circuitry for communicating with one or more users or other systems or devices. The input/output circuitry, for example, can include one or more interfaces for providing and/or receiving information from one or more users or other systems or devices of the phase shifting system 800 or otherwise. The input/output circuitry can be configured to receive user input or input from various other systems or devices through one or more of the interfaces of the phase shifting system 800.

CONCLUSION

Many modifications and other embodiments of the disclosures set forth herein will come to mind to one skilled in the art to which these disclosures pertain having the benefit of teachings presented in the foregoing descriptions and the associated drawings. Although the figures only show certain components of the apparatus and systems described herein, it is understood that various other components may be used in conjunction with the system. Therefore, it is to be understood that the disclosures are not to be limited to the specific embodiments disclosed and that modifications and other embodiments are intended to be included within the scope of the appended claims. Moreover, the steps in the method described above may not necessarily occur in the order depicted in the accompanying diagrams, and in some cases one or more of the steps depicted may occur substantially simultaneously, or additional steps may be involved. Although specific terms are employed herein, they are used in a generic and descriptive sense only and not for purposes of limitation.

While various embodiments in accordance with the principles disclosed herein have been shown and described above, modifications thereof may be made by one skilled in the art without departing from the spirit and the teachings of the disclosure. The embodiments described herein are representative only and are not intended to be limiting. Many variations, combinations, and modifications are possible and are within the scope of the disclosure. The disclosed embodiments relate primarily to phase shifting techniques for phase shifters, however, one skilled in the art may recognize that such principles may be applied to any phase modification device. Alternative embodiments that result from combining, integrating, and/or omitting features of the embodiment(s) are also within the scope of the disclosure. Accordingly, the scope of protection is not limited by the description set out above.

Additionally, the section headings used herein are provided for consistency with the suggestions under 37 C.F.R. 1.77 or to otherwise provide organizational cues. These headings shall not limit or characterize the disclosure(s) set out in any claims that may issue from this disclosure.

Use of broader terms such as "comprises," "includes," and "having" should be understood to provide support for narrower terms such as "consisting of," "consisting essentially of," and "comprised substantially of" Use of the terms "optionally," "may," "might," "possibly," and the like with respect to any element of an embodiment means that the element is not required, or alternatively, the element is required, both alternatives being within the scope of the embodiment(s). Also, references to examples are merely provided for illustrative purposes, and are not intended to be exclusive.

While this detailed description has set forth some embodiments of the present disclosure, the appended claims cover other embodiments of the present disclosure which differ from the described embodiments according to various modifications and improvements.

The invention claimed is:

1. A phase shifter, comprising:
   a plurality of digital phase shifters, each digital phase shifter of the plurality of the digital phase shifters configured to vary a phase of a phase shifter input signal by a corresponding phase shift value; and
   a continuous phase shifter configured to vary the phase of the phase shifter input signal with a variable phase shift value,
   wherein the continuous phase shifter comprises a continuous phase shifter load configured to:
   receive a control voltage; and
   vary the variable phase shift value using the control voltage;

wherein the corresponding phase shift value to each of the digital phase shifters remains at approximately a corresponding low digital phase shift value when a switch of the digital phase shifter is on and remains at approximately a corresponding high digital phase shift value when a switch of the digital phase shifter is off; and wherein the variable phase shift value varies between a minimum continuous phase shift value and a maximum continuous phase shift value, wherein the difference between the maximum and the minimum continuous phase shift value is a minimum of the corresponding phase shift values provided by the digital phase shifters.

2. The phase shifter of claim 1, wherein the plurality of digital phase shifters and the continuous phase shifter are electrically coupled to each other in series.

3. The phase shifter of claim 2, wherein a sum of each of the corresponding phase shift values to the digital phase shifters and a maximum variable phase shift value is about 360°.

4. The phase shifter of claim 1, wherein the continuous phase shifter load comprises:

a first electrical component having a capacitance, wherein the capacitance of the first electrical component is configured to vary in response to the control voltage; and a second electrical component having an inductance, wherein the second electrical component is electrically coupled to the first electrical component in parallel.

5. The phase shifter of claim 4, wherein the continuous phase shifter is configured to vary the variable phase shift value between a minimum variable phase shift to a maximum variable phase shift value by varying the control voltage from a minimum control voltage to a maximum control voltage value.

6. The phase shifter of claim 4, wherein the continuous phase shifter is a Reflective-Type Phase Shifter (RTPS).

7. The phase shifter of claim 4, wherein the second electrical component comprises a switched inductor configured to have a first inductance and a second inductance in response to a state of a switch.

8. The phase shifter of claim 7, wherein the switched inductor comprises:

a first inductor comprising:

a first inductive strip; and a first port, wherein a first pin of the first port is electrically coupled to the first electrical component and a second pin of the first port is electrically coupled to a circuit ground; and a second inductor comprising:

a second inductive strip disposed in a way to be electromagnetically coupled with the first inductive strip;

a second port; and the switch electrically coupled to a first pin of the second port and a second pin of the second port.

9. The phase shifter of claim 8, wherein the switch is configured to:

create an open circuit in the second port when the switch is in an off state; and create a short circuit in the second port when the switch is in an on state, wherein an inductance of the switched inductor is lowered when the switch is in the on state compared to when the switch is in the off state.

10. The phase shifter of claim 9, wherein the continuous phase shifter is configured to:

vary the variable phase shift value between about a minimum variable phase shift value and an intermediate variable phase shift value, by varying the control voltage between a maximum control voltage value and an intermediate control voltage when the switch is in the on state; and vary the variable phase shift value between the intermediate variable phase shift value and a maximum variable phase shift value, by varying the control voltage between the maximum control voltage value and a lower control voltage value when then switch is in the off state, wherein the intermediate control voltage value is greater than the lower control voltage value and the lower control voltage value is greater than a minimum control voltage, and wherein the intermediate variable phase shift value is greater than the minimum variable phase shift value and less than the maximum variable phase shift value.

11. The phase shifter of claim 10, wherein the continuous phase shifter is configured to vary an insertion loss of the phase shifter between a lower insertion loss and a new upper insertion loss when varying the variable phase shift value between about zero and the maximum variable phase shift value.

12. A phase shifter, comprising:

a first digital phase shifter configured to vary a phase of a phase shifter input signal by a first phase shift value;

a second digital phase shifter configured to vary the phase of the phase shifter input signal by a second phase shift value;

a third digital phase shifter configured to vary the phase of the phase shifter input signal by a third phase shift value;

a fourth digital phase shifter configured to vary the phase of the phase shifter input signal by a fourth phase shift value;

a continuous phase shifter configured to vary the phase of the phase shifter input signal with a variable phase shift value; and a continuous phase shifter load configured to:

receive a control voltage; and vary the variable phase shift value using the control voltage;

wherein the first phase shift value provided by the first digital phase shifter remains at approximately a first low digital phase shift value when a switch of the first digital phase shifter is on and remains at approximately a corresponding high first digital phase shift value when the switch of the first digital phase shifter is off;

wherein the second phase shift value provided by the second digital phase shifter remains at approximately a second low digital phase shift value when a switch of the second digital phase shifter is on and remains at approximately a corresponding high second digital phase shift value when the switch of the second digital phase shifter is off;

wherein the third phase shift value provided by the third digital phase shifter remains at approximately a third low digital phase shift value when a switch of the third digital phase shifter is on and remains at approximately a corresponding high third digital phase shift value when the switch of the third digital phase shifter is off;

wherein the fourth phase shift value provided by the fourth digital phase shifter remains at approximately a fourth low digital phase shift value when a switch of the fourth digital phase shifter is on and remains at approximately a corresponding high fourth digital phase shift value when the switch of the fourth digital phase shifter is off; and wherein the variable phase shift value varies between about zero and a minimum of the phase shift values provided by the first, second, third, or fourth digital phase shifters.

13. The phase shifter of claim 12, wherein the first digital phase shifter, the second digital phase shifter, the third digital phase shifter, the fourth digital phase shifter, and the continuous phase shifter are electrically coupled to each other in series.

14. The phase shifter of claim 13, wherein a sum of the first phase shift value, the second phase shift value, the third phase shift value, and the fourth phase shift value when the corresponding digital phase shifter is on, and a maximum variable phase shift value is about 360°.

15. The phase shifter of claim 13, wherein the first phase shift value when the first digital phase shifter is on is about 22.5°, the second phase shift value when the second digital phase shifter is on is about 45°, the third phase shift value when the third digital phase shifter is on is about 90°, and the fourth phase shift value when the fourth digital phase shifter is on is about 180°, and a maximum variable phase shift value is about 22.5°.

16. A continuous phase shifter comprises a continuous phase shifter load comprising:

a first electrical component having a capacitance, wherein the capacitance of the first electrical component is configured to vary in response to a control voltage; and a second electrical component having an inductance, wherein the second electrical component is electrically coupled to the first electrical component in parallel and comprises a switched inductor configured to have a first inductance and a second inductance in response to a state of a switch;

wherein the switched inductor comprises:

a first inductor comprising:

a first inductive strip; and a first port, wherein a first pin of the first port is electrically coupled to the first electrical component and a second pin of the first port is electrically coupled to a circuit ground; and a second inductor comprising:

a second inductive strip disposed in parallel to the first inductive strip;

a second port; and the switch electrically coupled to a first pin of the second port and a second pin of the second port, wherein the switch is configured to create an open circuit in the second port when the switch is in an off state and create a short circuit in the second port when the switch is in an on state; and wherein an inductance of the inductor is lowered when the switch is in the on state compared to when the switch is in the off state.

17. The phase shifter of claim 16, wherein the continuous phase shifter is configured to:

vary the variable phase shift value between about a minimum variable phase shift and an intermediate variable phase shift value, by varying the control voltage between a maximum control voltage value and an intermediate control voltage when the switch is in the on state; and vary the variable phase shift value between the intermediate variable phase shift value and a maximum variable phase shift value, by varying the control voltage between the maximum control voltage value and a lower control voltage value when then switch is in the off state, wherein the intermediate control voltage value is greater than the lower control voltage value and the lower control voltage value is greater than a minimum control voltage, and wherein the intermediate variable phase shift value is greater than the minimum variable phase shift and less than the maximum variable phase shift value and the continuous phase shifter is configured to vary an insertion loss of the phase shifter between a lower insertion loss and a new upper insertion loss when varying the variable phase shift value between the minimum variable phase shift and the maximum variable phase shift value.

* * * * *